United States Patent
Jwo

[11] Patent Number: 6,156,596
[45] Date of Patent: Dec. 5, 2000

[54] METHOD FOR FABRICATING A COMPLEMENTARY METAL OXIDE SEMICONDUCTOR IMAGE SENSOR

[75] Inventor: Mao-Shin Jwo, Chang-Hua Hsien, Taiwan

[73] Assignee: United Microelectronics Corp., Hsinchu, Taiwan

[21] Appl. No.: 09/210,275

[22] Filed: Dec. 10, 1998

[51] Int. Cl.[7] .............................................. H01L 21/8238
[52] U.S. Cl. ...................... 438/220; 438/207; 438/225; 257/395; 257/396; 257/509
[58] Field of Search ................... 438/207, 220, 438/225, 227, 228, 462, 465; 257/395, 396, 509

[56] References Cited

U.S. PATENT DOCUMENTS

| | | | |
|---|---|---|---|
| 5,622,885 | 4/1997 | Merrill et al. ............................ | 438/220 |
| 5,627,398 | 5/1997 | Zlebir et al. ............................. | 257/427 |
| 5,895,237 | 4/1999 | Chan et al. .............................. | 438/225 |
| 5,908,308 | 6/1999 | Barsan et al. ........................... | 438/225 |
| 6,037,211 | 3/2000 | Jeng et al. ............................... | 438/253 |

*Primary Examiner*—Charles Bowers
*Assistant Examiner*—David S Blum
*Attorney, Agent, or Firm*—Hickman Coleman & Hughes, LLP

[57] ABSTRACT

A method for fabricating a CMOS image sensor resolves the abnormally elevated output at the first pixel without degrading the integration of the device. The method of the invention lengthens the field oxide layer within the scribe-line region to ensure the substrate and the conducting layer thereon are properly insulated. That prevents the leakage of the carriers generated by the Electro-optical effect to resolve the problem of an abnormally elevated output at the first pixel. In addition, a mask protects the dielectric layer on the scribe-line region from being etched, so the steep difference on the step height is improved to resolve the peeling of the photoresist. The field oxide layer under the dielectric layer covered by the dielectric layer then provides a better insulation.

7 Claims, 3 Drawing Sheets

METHOD FOR FABRICATING A COMPLEMENTARY METAL OXIDE SEMICONDUCTOR IMAGE SENSOR

BACKGROUND OF THE INVENTION

1. Field of the Invention

This invention relates to a method for fabricating a complementary metal oxide semiconductor (CMOS) image sensor, and more particularly, to a method for fabricating a CMOS image sensor that resolves the abnormally elevated output at the first pixel of the CMOS image sensor.

2. Description of Related Art

A complementary metal oxide semiconductor (CMOS) image sensor, an image-sensing module consisting, of several chips, is generally used in electronic devices such as a scanner and a fax machine wherein each of the chips contains a number of pixels. Conventionally, the layout of the chips for composing the image-sensing module on a wafer is shown in FIG. 1 wherein each of the chips contains, for example, 96 pixels. Referring to FIG. 1, every chip 100 contains 96 pixels 101, wherein every chip 100 are separated from the neighboring chip 100 by a scribe line 102, and wherein the pixels are separated from each other by a separation 103. After the fabrication process on the wafer is accomplished, the chips 100 have to be sectioned from the wafer by cutting along the scribe line 102, and then, used to compose an image-sensing module. For an image-sensing module, the separations 103 between pixels 101 are required to be even, that is, the separation between two pixels on the near ends of two neighboring chips has to equal to the separation 103. Therefore, it is not allowed to lay a seal ring on the chip because the seal ring occupies a extra space on the edge of each chip 100, and further increases the separation between two pixels on the near ends of two neighboring chips. Without the presence of a seal ring, a peeling problem caused by the difference of step height often occurs along the edge of a photoresist layer formed on the wafer. As a result a portion of the field oxide (FOX) layer under the peeled photoresist layer tends toward being damaged by an etching process. The damaged field oxide layer on the cut edge of each chip further causes defects including lacking of insulation over the substrate, and undesired connection between the substrate and metal layers. Therefore, an abnormal elevated output happens on the first pixel of a chip because of the foregoing defects.

A schematic cross-sectional view showing the structure of the first pixel on a chip composing a conventional COMS image sensor is shown in FIG. 2. FIG. 3 is a partially detailed schematic cross-sectional view showing the defects occurs at the first pixel that cause an abnormally elevated output.

In FIG. 2, a heavy doped P-type region 203 works as depletion located on a N-type substrate 200. Besides, the N-type substrate 200 contains P-well 201, field oxide 202. N-type heavy doped regions 204 and 205, dielectric layer 206, and conducting layer 207. The first pixel 208 consists of devices between two field oxide layers 202. The region to the left of the dash line 209 is reserved as the scribe line.

Referring to FIG. 3, which is a partially detailed view of the area 210 in FIG. 2, a portion of the field oxide 202 is removed by an etching process to form unwanted space between the field oxide and the edge of the first pixel, because of the peeling of the photoresist layer. Hence, an undesired connection between the metal layer 212 formed by a follow-up metalization process and the substrate 200 occurs.

According to the foregoing, the field oxide on the edge of the first pixel next to the scribe line of each chip cannot provide sufficient insulation, so the undesired connections between the substrate under the field oxide and a conducting layer lead to a abnormally elevated output at the first pixel.

SUMMARY OF THE INVENTION

It is therefore an objective of the present invention to provide a method for fabricating a CMOS image sensor that prevents the occurrence of an abnormally elevated output at the first pixel caused by insufficient insulation.

It is another an objective of the present invention to provide a method for fabricating a CMOS image sensor that resolves the problem of a conventional method caused by lacking of sufficient insulation without increasing the planar size of the device.

In accordance with the foregoing and other objectives of the invention, the invention provides a method for fabricating a CMOS image sensor that includes a lengthened field oxide layer located between a device region and a close-by scribe line. More particularly, a portion of the lengthened field oxide layer is extended to the scribe-line region. The invention also provides a mask to cover the scribe-line region, so that the dielectric layer above the scribe-line region is protected form being etched away.

In accordance with the foregoing and other objectives of the invention, the invention provides another method for fabricating a CMOS image sensor that starts with forming a dielectric layer on a provided N-type substrate. The provided N-type substrate already contains a pre-formed P-well, a field oxide layer, and a N-type doped region on the P-well. A mask is then formed on the dielectric layer, wherein the mask contains an opening that exposes the N-type doped region. By performing an etching process together with the presence of the mask, a contact hole is formed on the dielectric layer. A metal layer is formed on the dielectric layer and in the contact hole after the mask is removed, and then the metal layer is patterned.

BRIEF DESCRIPTION OF THE DRAWING

The invention can he more fully understood by reading the following detailed description of the preferred embodiments, with reference made to the accompanying drawings, wherein.

DETAILED DESCRIPTION OF PREFERRED EMBODIMENTS

The invention provides a method for fabricating a complementary metal oxide semiconductor (CMOS) image sensor to overcome the drawback of a conventional method including the occurrence of abnormally elevated output at the first pixel of the CMOS image sensor. The field oxide layer located between the device region and the scribe-line region is lengthened, so a portion of the field oxide layer is extended to the scribe-line region. Additionally, the invention provides a mask, which covers the scribe-line region, to protect the dielectric layer on the scribe-line region from being etched by a contact etching process performed thereon.

Figure 1:
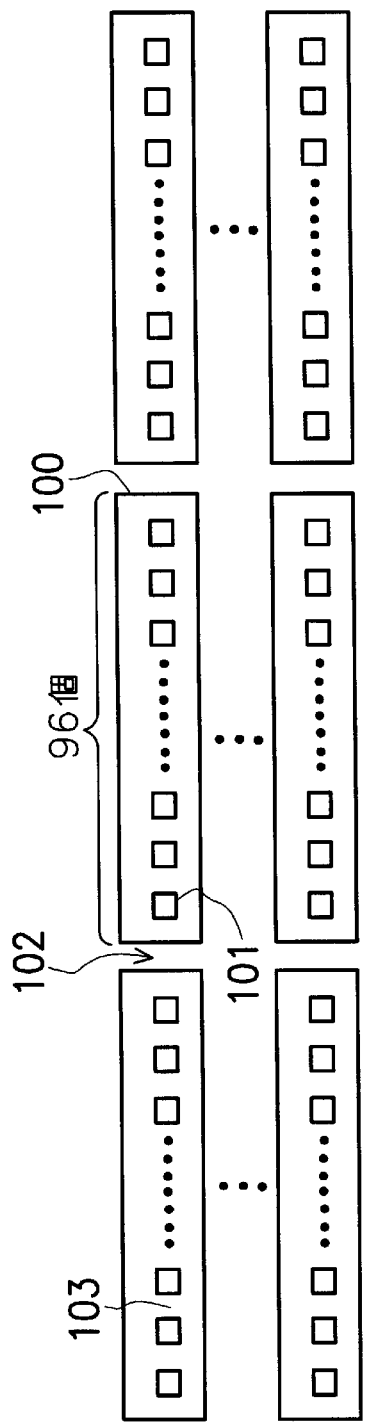
FIG. 1 is a schematic block diagram showing the arrangement of chips in a conventional CMOS image sensor.
Figure 2:
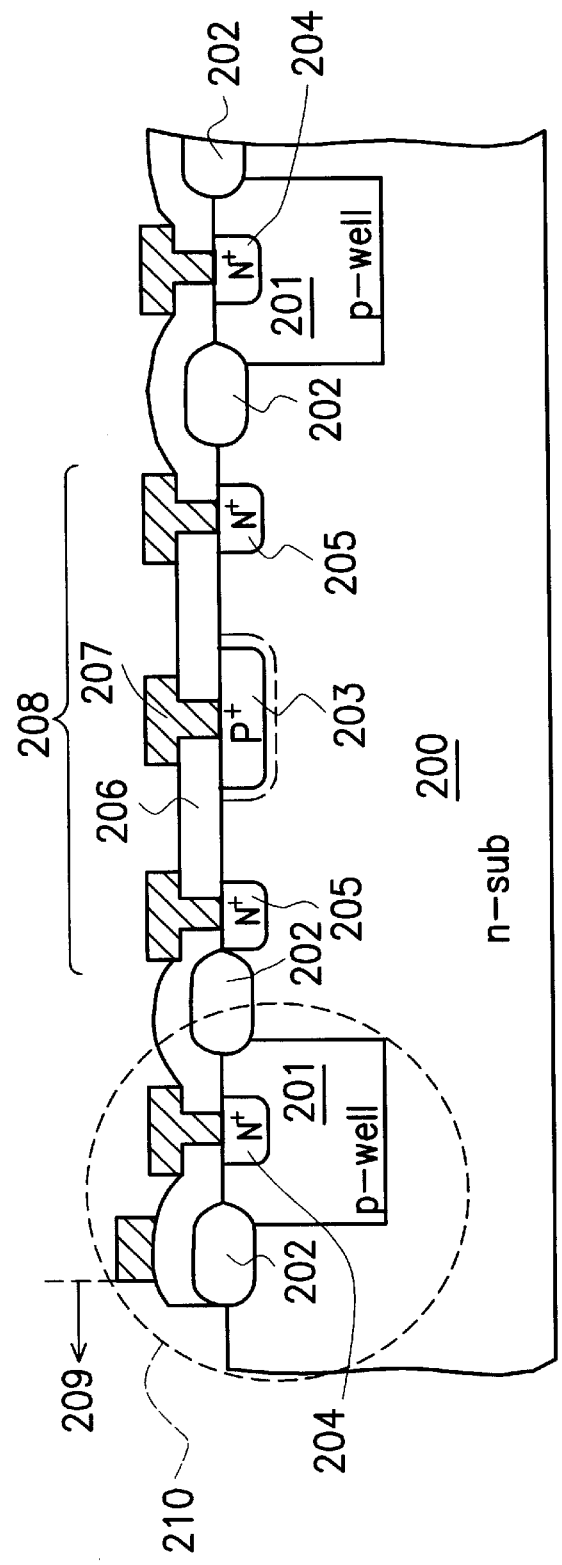
FIG. 2 is a schematic cross-sectional view showing, the structure of the first pixel in a conventional CMOS image sensor.
Figure 3:
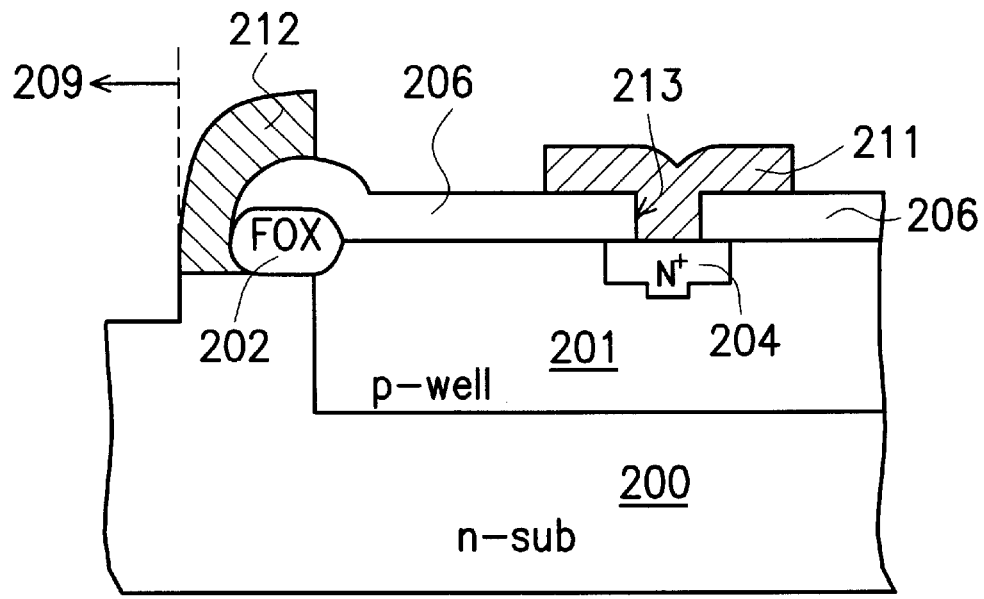
FIG. 3 is a more detailed schematic cross-sectional view showing the structure of the first pixel in a conventional CMOS image sensor.
Figure 4A:
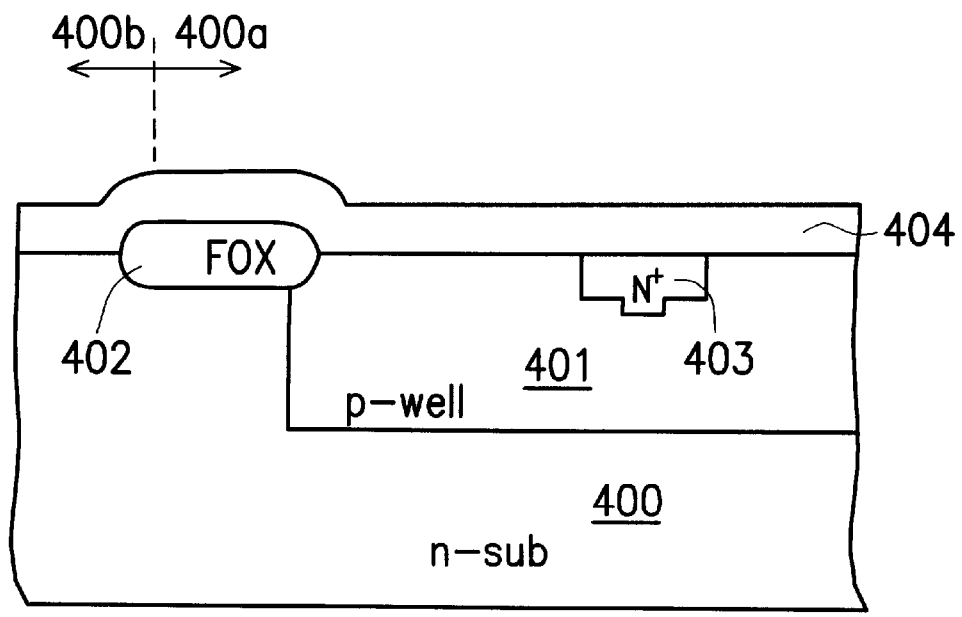
FIGS. 4A through 4C are schematic cross-sectional views showing the structure of the formation of a CMOS image sensor formed by a method described in a preferred embodiment of the invention.
Figure 4B:
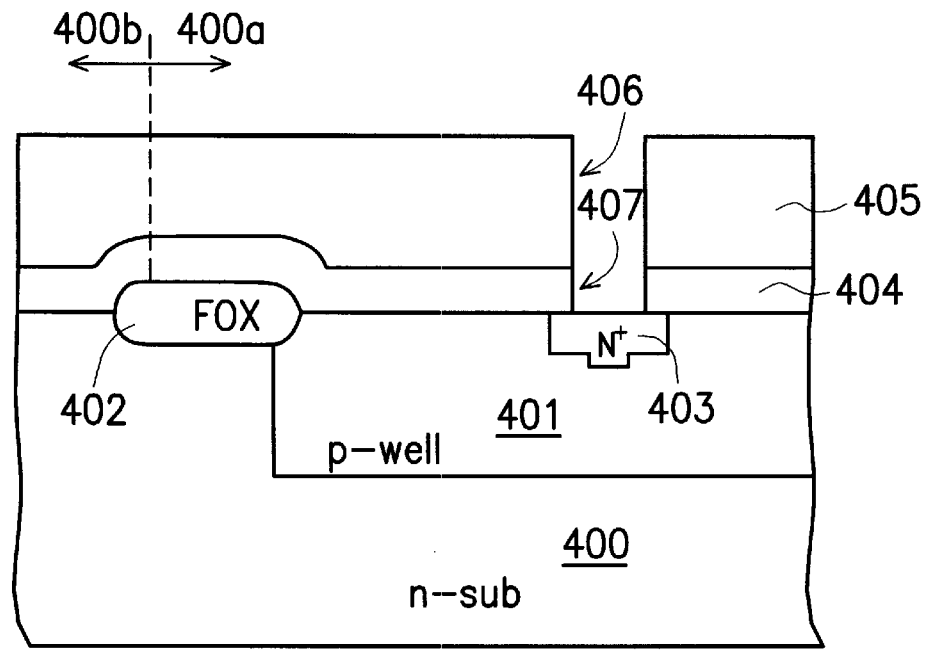
Figure 4C:
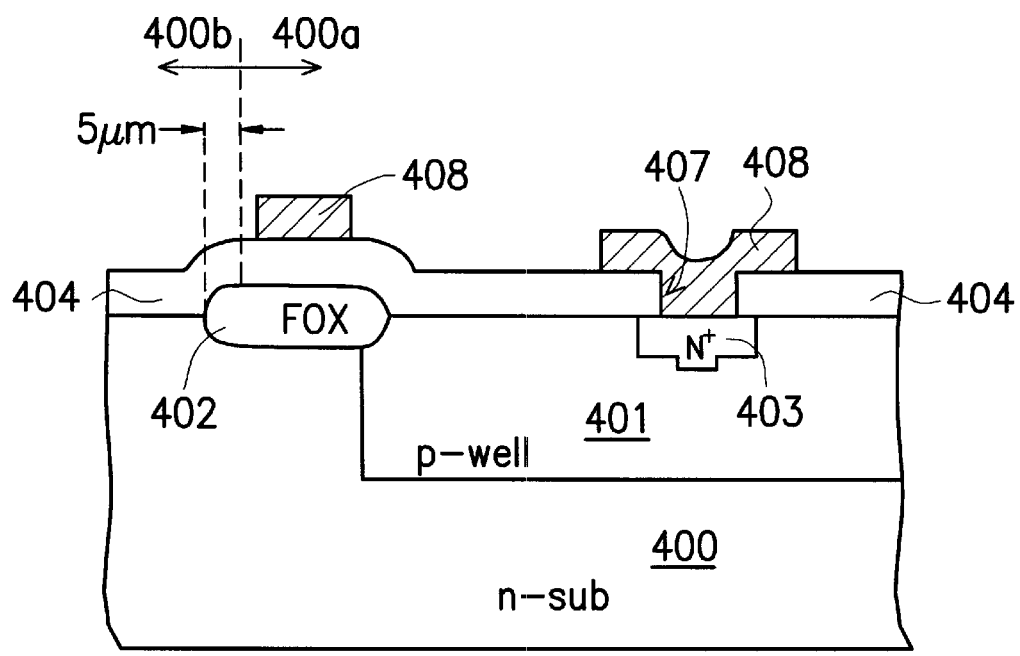

FIGS. 4A through 4C are schematic cross-sectional views showing the structure of the formation of a CMOS image sensor formed by a method of the invention.

Referring to FIG. 4A, a dielectric layer 404 is formed on a provided N-type substrate 400, wherein the provided N-type substrate contains pre-formed devices including a P-well 401, a field oxide layer 402 and a N-type doped region 403. The substrate 400 further divided into a device region 400a and a scribe-line region 400b by the field oxide layer 402. The P-well 401, which contains the N-type doped region 403, is located in the device region 400a.

Referring next to FIG. 4B, an etching process is performed on the dielectric layer 404 to form a contact hole 407 corresponding to the location of the N-type doped region 404.

Referring to FIG. 4C, a conducting layer 408 is formed to cover the dielectric layer 404 and fill the contact hole 407. The conducting layer 408, such as a metal layer, is then patterned.

The method of the invention for fabricating a CMOS image sensors forms a lengthened field oxide layer 402 located within the scribe-line region 400b without affecting the planar size of the chip, wherein the field oxide layer is lengthened by about 5 µm. In the presence of the lengthened field oxide layer 402, the substrate 400 of the first pixel is better isolated and protected, and carriers generated by the Electro-optical effect are barred from leaking into the first pixel.

The more detailed description on the method of the invention shown in FIGS. 4B and 4C are as following.

Referring to FIG. 4B, a mask layer 405 is formed on the dielectric layer 404, wherein the mask layer can be a photoresist layer or any other materials capable of achieving the same goal. The mask layer 405 contains a opening 406 located correspondingly to the position of the N-type doped region 403. By using the mask layer 405 as an etching mask a etching process is performed to form a contact hole 407 on the dielectric layer 402 to expose the N-type doped region 403.

Referring next FIG. 4C, a conducting layer 408 is formed on the dielectric layer 404 after the mask layer 405 is removed. The conducting layer 405 is then patterned to a desired layout.

The method of the invention for fabricating a CMOS image sensor forms a mask 405 to cover a portion of the dielectric layer 404 within the scribe-line region, so that the dielectric layer 404 within the scribe-line region is not etched. The problem including, peeling photoresist layer caused by a steep difference on the step height is resolved. Hence, the field oxide layer 402 is not etched.

According to the foregoing preferred embodiment of the invention, the invention provides a method for fabricating a CMOS image sensor that resolves the abnormally elevated output at the first pixel without degrading the integration of the device. The method of the invention lengthens the field oxide layer within the scribe-line region to ensure the substrate and the conducting layer thereon are properly insulated. That prevents the leakage of the carriers generated by the Electro-optical effect to resolve the problem of an abnormally elevated output at the first pixel. In addition, a mask protects the dielectric layer on the scribe-line region from being etched, so the steep difference on the step height is improved to resolve the peeling of the photoresist. The field oxide layer under the dielectric layer covered by the dielectric layer then provides a better insulation.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a complementary metal oxide semiconductor (CMOS) image sensor, the method comprising:

providing an N-type substrate, wherein the N-type substrate further comprises a device region and a scribe-line region, the device region and the scribe-line region being separated by a lengthened field oxide layer, and the lengthened field oxide layer extending to the scribe-line region;

forming a dielectric layer on the N-type substrate to cover the scribe-line region and the device region;

forming a mask layer on the dielectric layer to cover the scribe-line region for preventing the dielectric layer above the scribe-line region from being etched, wherein the mask layer contains an opening located correspondingly to a location of an N-type doped region of a P-well within the N-type substrate;

performing an etching process on the dielectric layer by utilizing the mask layer as an etching mask to form a contact hole;

removing the mask layer;

forming a conducting layer on the dielectric layer and in the contact hole; and patterning the conducting layer.

2. The method of claim 1, wherein the mask layer includes photoresist.

3. The method of claim 1, wherein the conducting layer includes metal layer.

4. A method for fabricating a complementary metal oxide semiconductor (CMOS) image sensor, the method comprising:

providing an N-type substrate, wherein the N-type substrate consists of a device region and a scribe-line region, and wherein the device region and a scribe-line region are separated by a lengthened field oxide layer which extends to the scribe-line region;

forming a dielectric layer on the N-type substrate to cover the scribe-line region and the device region;

forming a mask layer on the dielectric layer to cover the scribe-line region for preventing the dielectric layer above the scribe-line region from being etched;

performing an etching process with the mask layer to form a contact hole;

forming a conducting layer on the dielectric layer and in the contact hole; and patterning the conducting layer.

5. The method of claim 4, wherein the mask layer includes photoresist.

6. The method of claim 4, wherein the conducting layer includes metal layer.

7. A method for fabricating a complementary metal oxide semiconductor (CMOS) image sensor, comprising:

forming a lengthened field oxide layer as an insulator and an isolation between a device region and a scribe-line region, wherein the scribe-line region is covered by a dielectric layer, and a portion of the lengthened field oxide layer is located within the scribe-line region; and covering the dielectric layer on the scribe-line region by a mask to prevent the dielectric layer from being etched.

* * * * *